(12) United States Patent
Bula et al.

(10) Patent No.: US 6,383,719 B1
(45) Date of Patent: **\*May 7, 2002**

(54) PROCESS FOR ENHANCED LITHOGRAPHIC IMAGING

(75) Inventors: Orest Bula, Shelburne; Daniel Cole, Jericho; Edward W. Conrad, Jeffersonville; Stephen E. Knight, Essex Junction; Robert K. Leidy, Burlington, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,456

(22) Filed: May 19, 1998

(51) Int. Cl.⁷ ................................................. G03F 7/20
(52) U.S. Cl. ........................ 430/312; 430/394; 430/396
(58) Field of Search ................................ 430/311, 313, 430/322, 394, 396, 397, 312

(56) References Cited

U.S. PATENT DOCUMENTS

| | | | |
|---|---|---|---|
| 3,155,505 A | 11/1964 | Shannon | 96/27 |
| 3,422,442 A | 1/1969 | Glendinning et al. | 346/107 |
| 4,021,239 A | 5/1977 | Ogawa | 96/27 |
| 4,264,711 A * | 4/1981 | Greeneich | 430/296 |
| 4,426,584 A | 1/1984 | Bohlen et al. | 250/492.2 |
| 4,935,334 A | 6/1990 | Boettiger et al. | 430/322 |
| 5,082,762 A * | 1/1992 | Takahashi | 430/296 |
| 5,308,741 A * | 5/1994 | Kemp | 430/312 |
| 5,340,700 A | 8/1994 | Chen et al. | 430/312 |
| 5,405,733 A | 4/1995 | Sirkin et al. | 430/313 |
| 5,413,898 A | 5/1995 | Kim et al. | 430/325 |
| 5,532,114 A | 7/1996 | Bae | 430/312 |
| 5,635,285 A * | 6/1997 | Bakeman, Jr. et al. | 428/195 |

FOREIGN PATENT DOCUMENTS

JP       7181668       7/1995

OTHER PUBLICATIONS

English Abstract of JP62–19860 (Jan. 28, 1987).

\* cited by examiner

*Primary Examiner*—Kathleen Duda
(74) *Attorney, Agent, or Firm*—James M. Leas; Mark F. Chadurjian

(57) ABSTRACT

Fine feature lithography is enhanced by selectively providing exposures to correct for effects such as foreshortening, corner rounding, nested to isolated print bias, feature size dependent bias, and other image biases in semiconductor processing. These results are achieved by increasing the local exposure dose in critical areas of specific images, such as line ends and corners. The general process incorporates techniques which tailor the exposure dose as a function of position to achieve the desired final image shape. The techniques include contrast enhancement layers (CEL), scanning optical beams, and exposures with different masks. In one embodiment the process of forming a pattern comprises the steps of providing a substrate having a photosensitive coating, exposing the center area of the pattern on the photosensitive coating with one mask, and exposing ends of the pattern on the photosensitive coating without exposing the center area with a second mask. The second exposure overlaps the first exposure and may extend beyond the pattern but the second dose is much lower than the first dose.

75 Claims, 18 Drawing Sheets

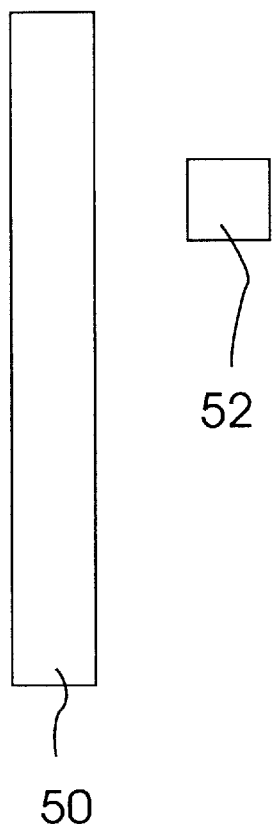
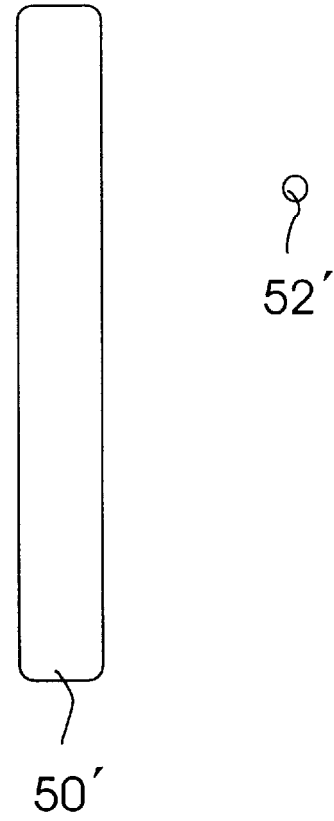
FIG. 20  
Prior Art
FIG. 21  
Prior Art

PROCESS FOR ENHANCED LITHOGRAPHIC IMAGING

FIELD OF THE INVENTION

This invention relates generally to techniques for fine feature lithography. More particularly, it relates to a method of enhancing resolution. Even more particularly, it relates to a method of compensating for mechanisms that degrade printed image quality. Finally it relates to a method of providing improved fidelity in providing patterns used in integrated circuits.

BACKGROUND OF THE INVENTION

There is a continuing trend in the field of integrated circuits to reduce the size of the circuitry. As a result, there is an increased demand to improve the resolution of projection printers and other devices used in lithography during the manufacture of integrated circuits.

FIG. 14 illustrates a mask pattern 10 to be formed on a substrate 12. FIG. 15 is an illustration of a printed image 14 formed in a photoresist using the mask pattern 10 shown in FIG. 14. As is shown in FIG. 15, the long axis LA2 of the printed image 14 shortens as compared to the long axis LA1 of mask pattern 10. This will henceforth be referred to as foreshortening.

FIG. 16 illustrates square mask image 190 to be formed on a substrate 12. FIG. 17 is an illustration of the printed image 190' using the mask image 190 shown in FIG. 16. As shown in FIG. 17, the corners of the image 190' become round during printing and developing compared to the mask image 190, because of optical (e.g., diffraction) and resist processing effects. This process is referred to here as "corner rounding."

FIG. 18 illustrates another mask pattern 40 containing both nested features 42a, 42b and an isolated feature 44. FIG. 19 is an illustration of printed image 40' using mask pattern 40 shown in FIG. 18. As demonstrated in FIG. 19, isolated feature 44' prints differently than nested features 42a' and 42b'. (Depending on effects such as diffraction, lens aberrations, and resist characteristics, isolated feature 44' can print either larger or smaller than nested feature 42a' and 42b'.) Also, the width of outside images 42b' in a group of nested images print differently than inside images 42a'. These two effects are referred to here as "nested-to-isolated print bias." Outside images 42b' are nested only on one side; consequently they experience less of a proximity effect than fully nested images 42a'.

FIG. 20 illustrates a mask which includes bar 50 and contact 52. FIG. 21 shows printed bar image 50' associated with mask bar image 50 and printed contact image 52' associated with mask image 52. When the bar image 50' is printed optimally, contact image 52' is poorly imaged, as shown in FIG. 21. If contact image 52' is printed optimally, bar image 50' is printed too wide. This effect is referenced to here as "feature size dependent bias."

Adjustments of the mask image to compensate for the foreshortening may be difficult when small images are to be formed in the photoresist. There is limited space between the images in arrays of high-density small images to apply compensation at the mask level (i.e., to grow the image in the direction that it will foreshorten) without introducing undesirable proximity effects such as image bridging.

One prior art technique to improve resolution is to use contrast enhanced layers (CEL) with projection printers. A photo-bleachable layer is spun onto a photoresist-coated wafer to a thickness of approximately 1,000–3,000 Å. Upon exposure of the CEL by the aerial image produced by the mask and projection printer, the regions of the photo-bleachable layer that are exposed to the highest intensities bleach through first, while those areas of the photo-bleachable layer that receive the lowest intensity bleach through at a later time. Therefore, windows in the CEL are formed which allow the imaging light to pass through and expose the underlying photoresist. The net effect is to increase the effective contrast of the CEL and photoresist stack over that of the photoresist alone. Contrast enhanced imaging or multilayer resists alone may be inadequate, however, for significant improvement of image foreshortening in advanced lithography.

To overcome the shortcomings of the prior art, a new process is provided. An object of the present invention is to provide an improved process to reduce image foreshortening, corner rounding, nested to isolated print bias, and other print biases.

SUMMARY OF THE INVENTION

To achieve this and other objects, and in view of its purposes, the present invention provides a process of forming a first device pattern having a first end, a second end, and a center area. The process comprises the steps of providing a substrate having a photosensitive coating, forming the center area of the first device pattern on the photosensitive coating, and forming one of the first end and the second end of the first device pattern on the photosensitive coating.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIG. 5 is a cross sectional view of a wafer showing the resist and contrast enhancement layers of FIG. 4a;

FIG. 20 is an image mask of a bar and a contact according to the prior art;

FIG. 21 illustrates inadequate exposure of the contact when the bar is properly exposed using the image mask shown in FIG. 20.

DETAILED DESCRIPTION OF THE INVENTION

Overview

Microelectronic photolithography involves the transfer of a design on a mask to a printed image in photoresist material on a semiconductor substrate. There are a number of commonly recognized physical factors that contribute to differences between the design and the printed image. These factors distort the shape of the printed image from the mask design. Some of these well known factors are: (1) diffraction limited illumination; (2) optical aberrations; (2) diffusion of photoactive compound or photo acid generator; (3) dissolution of photoresist; (4) thin film interference in (e.g., standing waves); (5) topography; (6) mask errors (biases, imperfections); (7) etching process; and (8) reflective notching.

The present invention is directed to processes that reduce some of the differences these factors produce, including foreshortening, corner rounding, nested to isolated print bias, feature size dependent bias, and other image biases in semiconductor processing. These results are achieved by increasing the local exposure dose in critical areas of specific images, such as line ends and corners. The general process incorporates a number of techniques which tailor the exposure dose as a function of position to achieve the desired final image shape. The technique includes use of contrast enhancement layers (CEL), scanning optical beams, and exposures with different masks.

In one embodiment two masks are used to form a single printed image and these two masks are variably illuminated. One mask is illuminated with a dose sufficient to develop part of the desired image. The other mask, a block clear mask overlaying regions that do not get enough dose in the first exposure, is exposed with a substantially lower dose (about 5–40% of the threshold dose, or more likely in the range from 10 to 20% of the threshold dose as determined by process simulation) so those regions that receive both exposures now receive illumination above the threshold exposures now receive illumination above the threshold dose. Of course these exposures can be performed in either order, and while the doses differ by a factor of five or ten, smaller or larger dose differences will also work as dictated by the particular photoresist and the processing conditions (such as bake temperature) used.

In another embodiment a single mask is used with variable illumination provided by relative scanning movement between mask and semiconductor. By providing a higher intensity or a longer dwell time, otherwise underexposed regions, such as corners and ends of bars, are provided with the larger dose needed to properly print.

DESCRIPTION OF THE EXEMPLARY EMBODIMENTS

In the first exemplary embodiment, a photoresist and mask process is used in conjunction with the CEL to increase the exposure intensity at the ends of the image.

Figure 1:
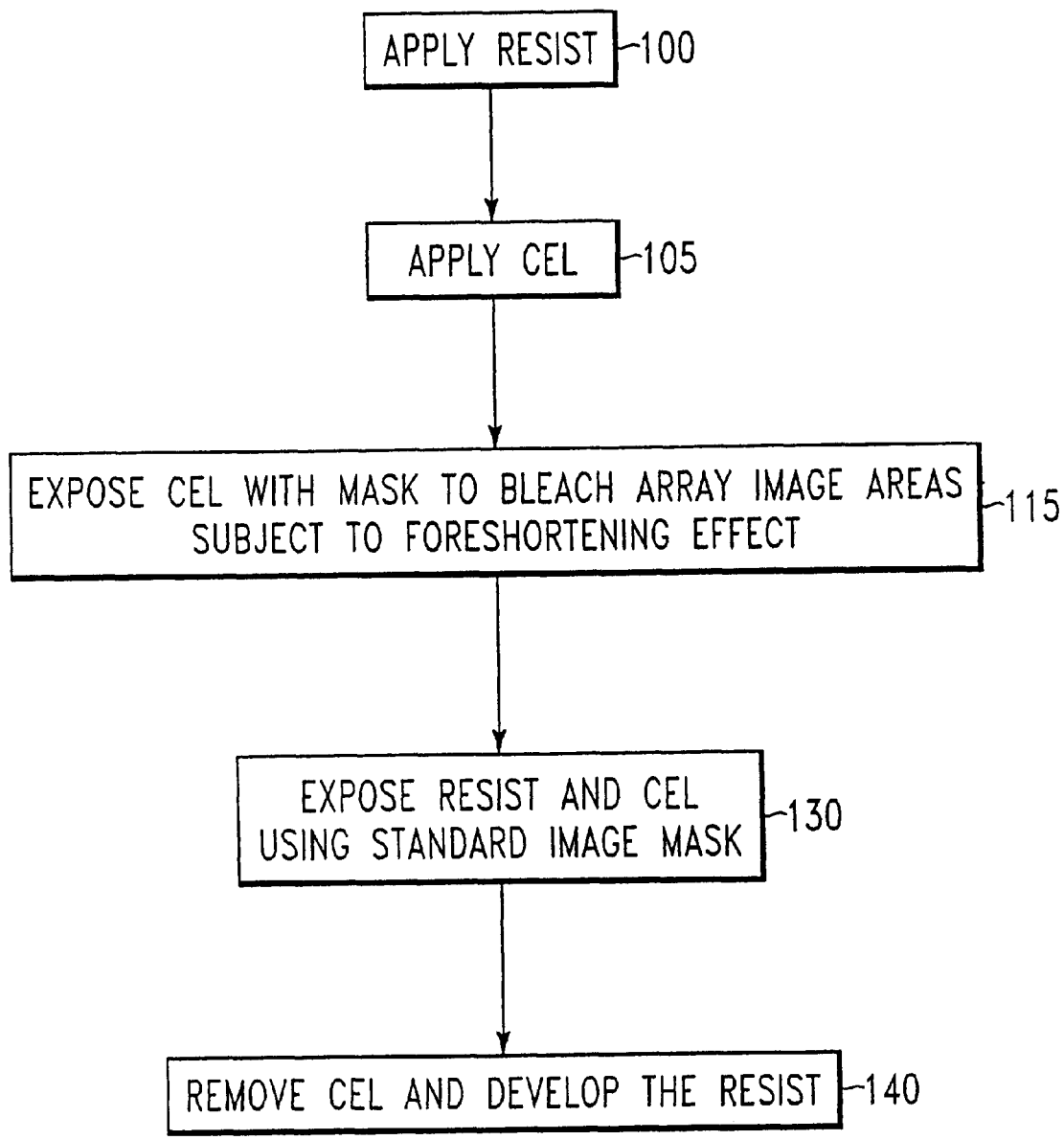
FIG. 1 is a flow chart diagram illustrating a first exemplary embodiment of the present invention.
Figure 2A:
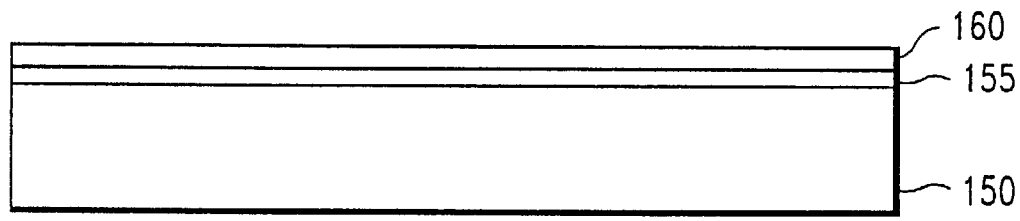
FIGS. 2A, 2B, and 2C illustrate the steps in making a device according to an exemplary embodiment of the present invention.

Referring now to the drawing, wherein like reference numerals refer to like elements throughout, FIG. 1 shows a process for forming a pattern (FIGS. 2a–2c) in a photoresist 155 corrected for foreshortening. The process shown in FIG. 1 is described below in conjunction with FIGS. 2A–2C. At step 100, a photoresist 155 is formed on a substrate 150 (shown in FIG. 2A). At step 105, a CEL layer 160 (shown in FIG. 2A) is formed on the photoresist 155. The CEL layer is, for example, ACTARC 2000 Series manufactured by Micro SI, Inc. of Cheshire, Conn.

Figure 2B:
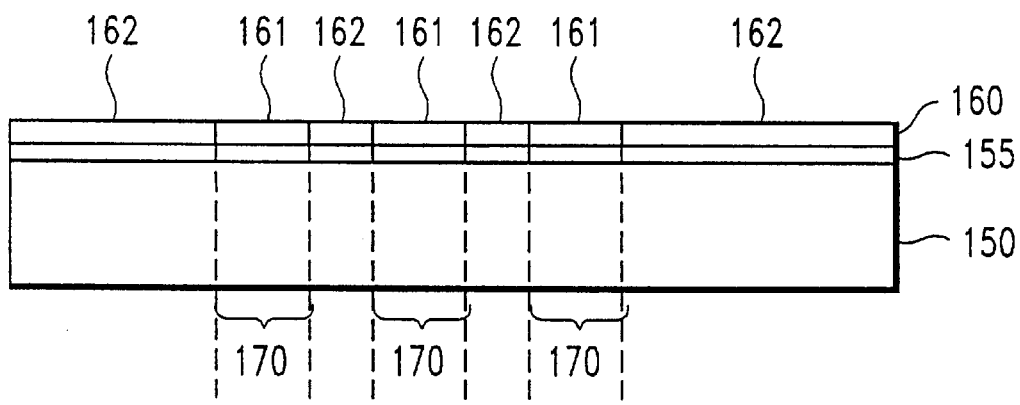
Figure 2C:
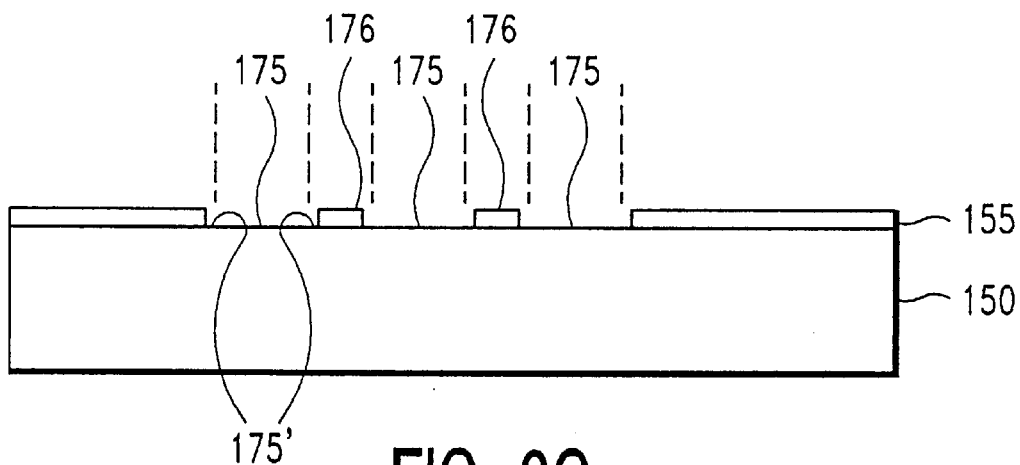

At step 115, selected areas of the CEL 160 are bleached with a mask (not shown) overlapping ends 175' of the images 175 (shown in FIG. 2C) and the region 176 between where those images 175 are to be formed. As shown in FIG. 2B, step 115 forms the bleached CEL area 162 and leaves CEL area 161 unbleached.

Figure 3:
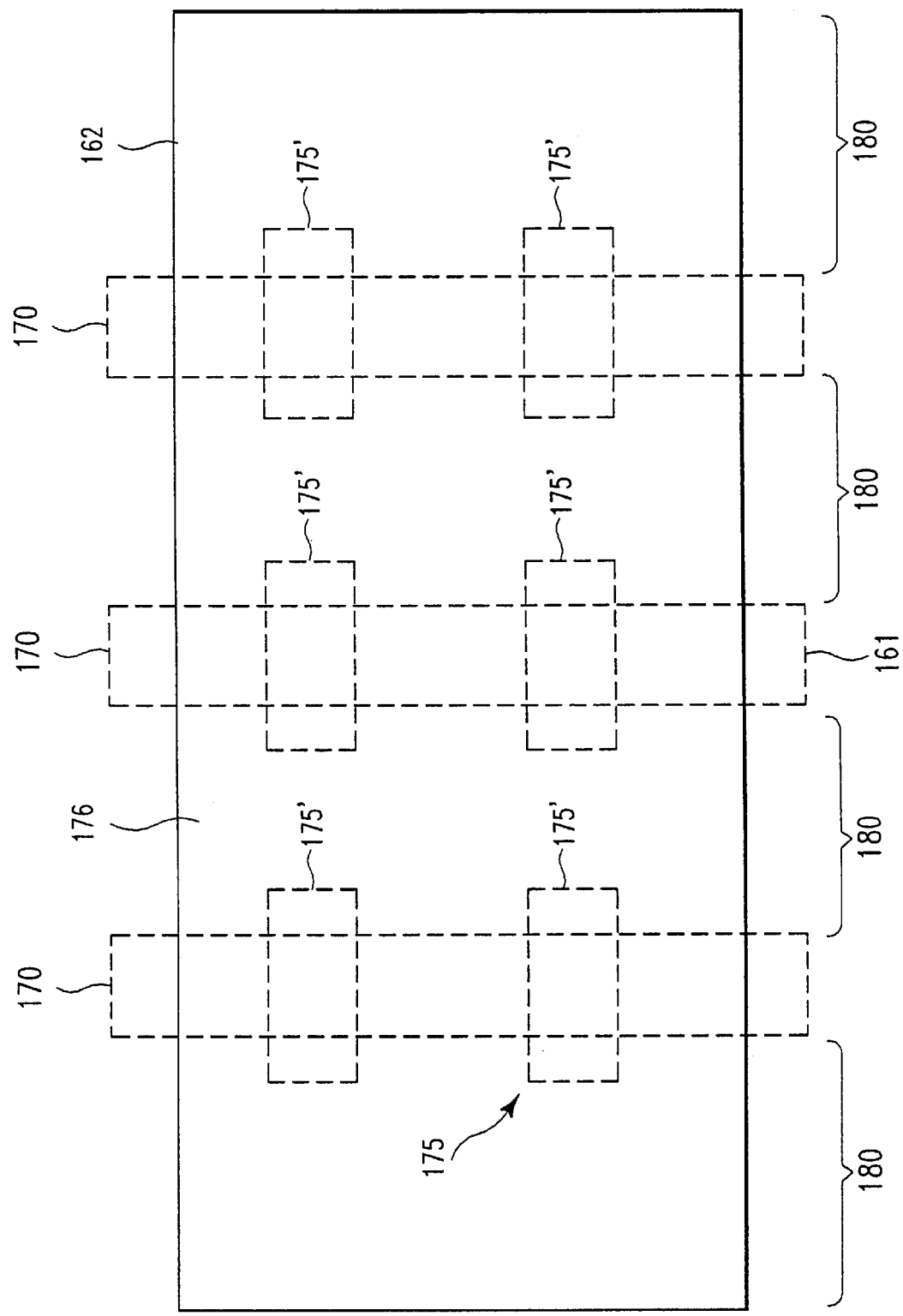
FIG. 3 is a top view of the device shown in FIG. 2C.

At step 130, the photoresist 155 and CEL areas 161 and 162 are exposed using a standard image mask having a pattern such as corrected images 175 (FIG. 3). The area of the photoresist above the regions 170 receives less exposure intensity because of the unbleached CEL area 161. Consequently, the resultant exposure of the photoresist 155 in the center of the image is reduced as compared to a conventional uniform exposure without a CEL over the resist. FIG. 3 is a top view of the patterned CEL areas 161 and 162 in relation to the image 175 to be formed. It is seen that photoresist at the ends 175' of images 175 in regions 180 receives a greater exposure than it would receive with only the standard image mask exposure. Just the ends 175' of images 175 get the higher dose, the center regions receiving a lower dose because of the presence of unbleached CEL.

Returning to FIG. 1, at step 140, the photoresist 155 and CEL areas 161 and 162 are developed to produce the images 175. The patterned CEL area 161 delays the exposure process in the region 170 of the image and increases the exposure process at ends 175' in the regions 180 to compensate for foreshortening. As a result, the printed images 175 are corrected and do not suffer from foreshortening. This technique for providing increased exposure at ends 175' also significantly improves corner rounding.

While a second layer of absorbing photoresist can be used in place of the CEL, a CEL has advantage in that it bleaches upon exposure, and processing steps for the second layer of resist, such as bake and develop, are avoided.

Figure 4A:
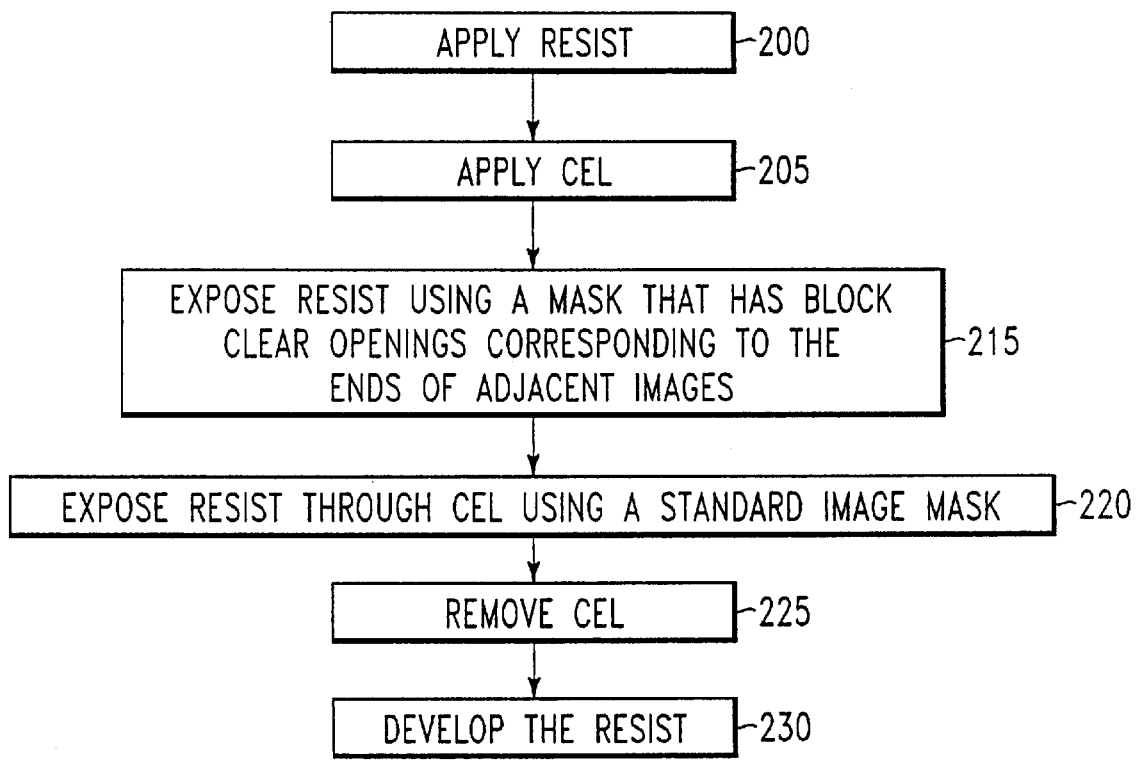
FIG. 4A is a flow chart diagram illustrating a second exemplary embodiment of the present invention.

FIG. 4A is a flow chart diagram of another exemplary embodiment according to the present invention. This embodiment employs a global exposure of the to minimize foreshortening effects. The processes shown in FIG. 4a are described below in conjunction with FIGS. 5 and 6.

Figure 5:
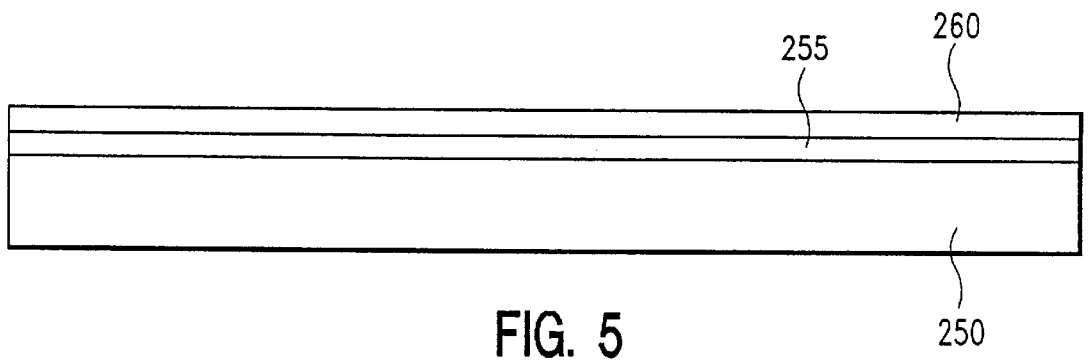
Figure 6:
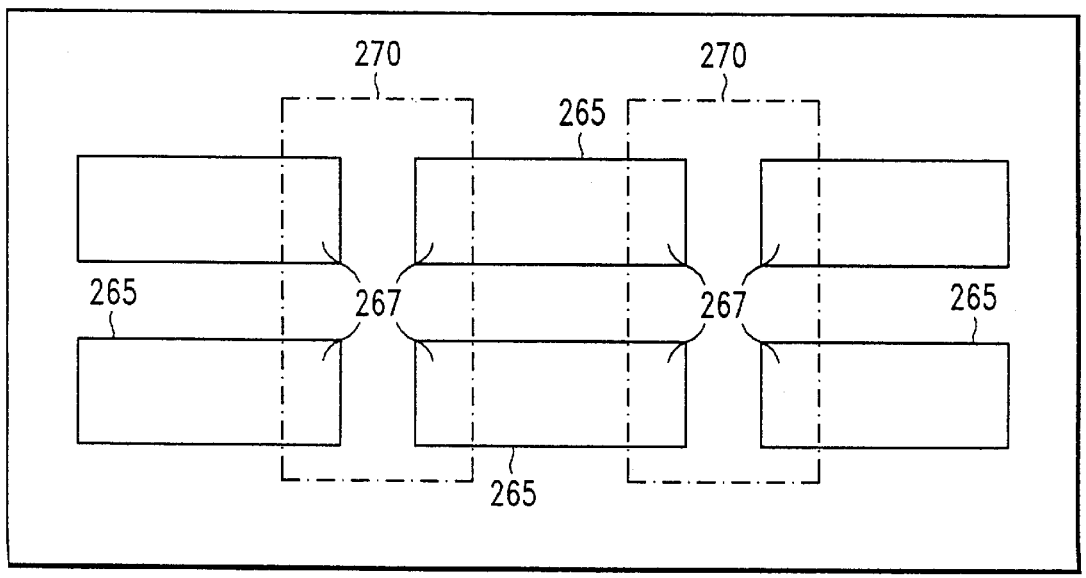
FIG. 6 is a top view of a pattern formed in photoresist on a wafer and produced by the process of FIGS. 4a and 4b.

At step 200, a photoresist 255 is formed on substrate 250 (shown in FIG. 5). At step 205, a CEL 260 is formed on the photoresist 255. At step 215, photoresist 255 is coarse exposed using a mask having windows (block openings 270) corresponding to the ends 267 of closely spaced images or adjacent images 265. Because the desired images 265 are adjacent other images 265, correction for foreshortening cannot be accomplished simply by extending the length of each image 265 on the mask. Thus, the present invention is most applicable to correct foreshortening of closely spaced or adjacent images 265. The windows used for the course exposure need not be accurately sized or positioned. They may be block openings 270, large regions not having a critical size, in the mask. The exposure with this block mask produces exposed regions 270 (shown in FIG. 6). In other words, the transparency of the CEL 260 at exposed regions 270 is increased.

At the next step 220, the photoresist 255 is exposed through the CEL 260 using a standard image mask having windows to form images 265 in the photoresist 255. The portions of the images 265 outside of block openings 270 which were not already exposed using the coarse exposure mask having block clear openings 270 has a delayed exposure. At step 230, the CEL 260 and photoresist 255 are developed to remove the CEL and to form the adjacent images 265.

As a result of the exposures with both the block clear mask to form block openings 270 and with the standard image mask to form images 265, the photoresist 255 at the ends 267 of images 265 receives a greater exposure than it would receive with only the standard image mask exposure. Thus, foreshortening effects are reduced, and the printed image more accurately replicates the intended design of the adjacent images 265 on the standard image mask.

Figure 4B:
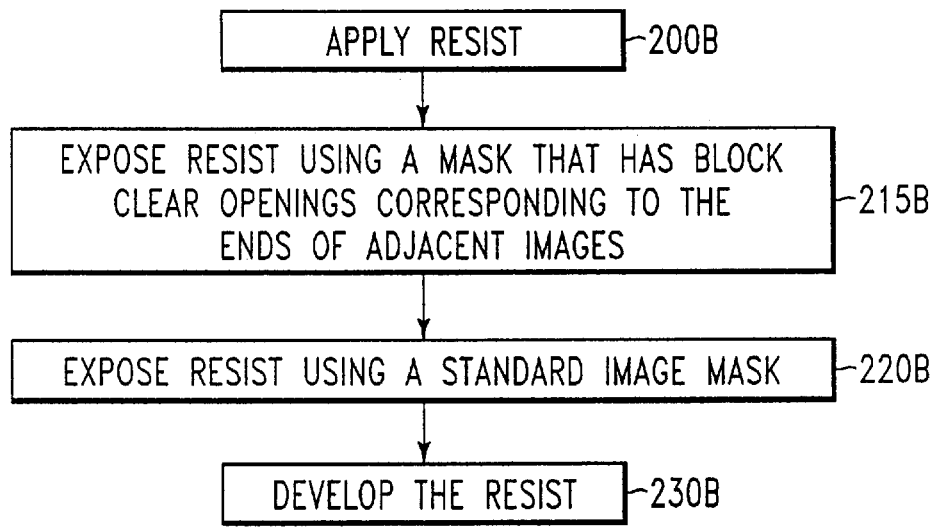
FIG. 4B is a flow chart diagram illustrating a third exemplary embodiment of the present invention.

FIG. 4B is a flow chart of an additional exemplary embodiment which does not require the use of a CEL. In this case, a coarse exposure partially exposes the ends 267 of the adjacent images 265. The adjacent images 265 are completely formed using a full exposure. In this way, the combination of the partial exposure of the ends of images 265 and the full exposure of images 265 compensates for foreshortening effects. In this alternative embodiment, steps 215B and 220B directly expose the resist using the block clear mask and the standard image mask.

Figure 7A:
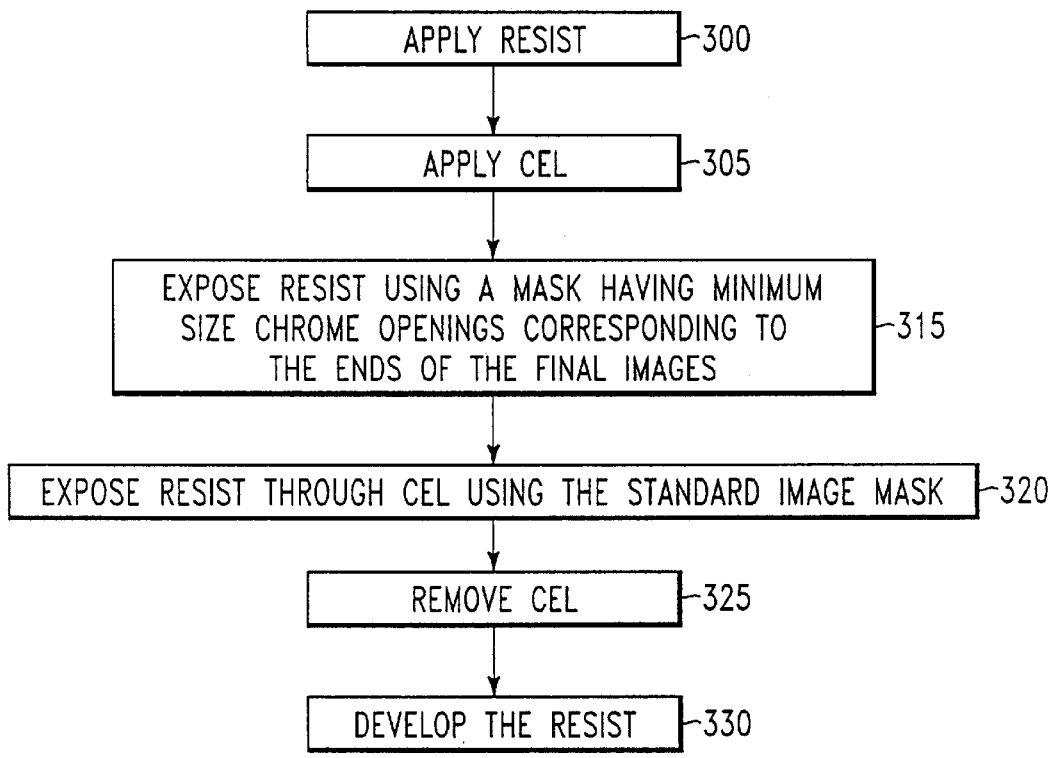
FIG. 7A is a flow chart diagram illustrating a fourth exemplary embodiment of the present invention.
Figure 8:
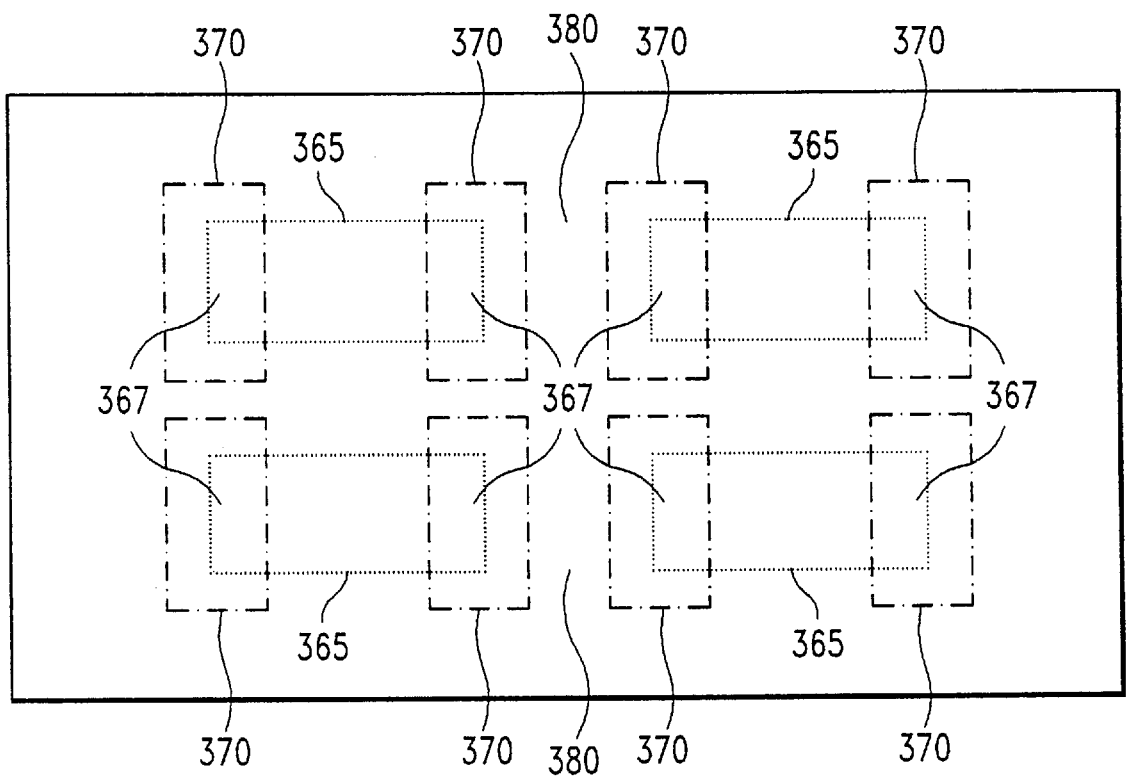
FIG. 8 is a top view of a pattern formed in photoresist on a wafer and produced by the process of FIGS. 7a and 7b.

FIG. 7A is a flow chart diagram of a further exemplary embodiment of the present invention. This embodiment employs a fine exposure of a CEL to tailor the exposure to form the adjacent images (shown in FIG. 8). The process shown in FIG. 7A is described below with reference to FIGS. 8 and 9.

Figure 9:
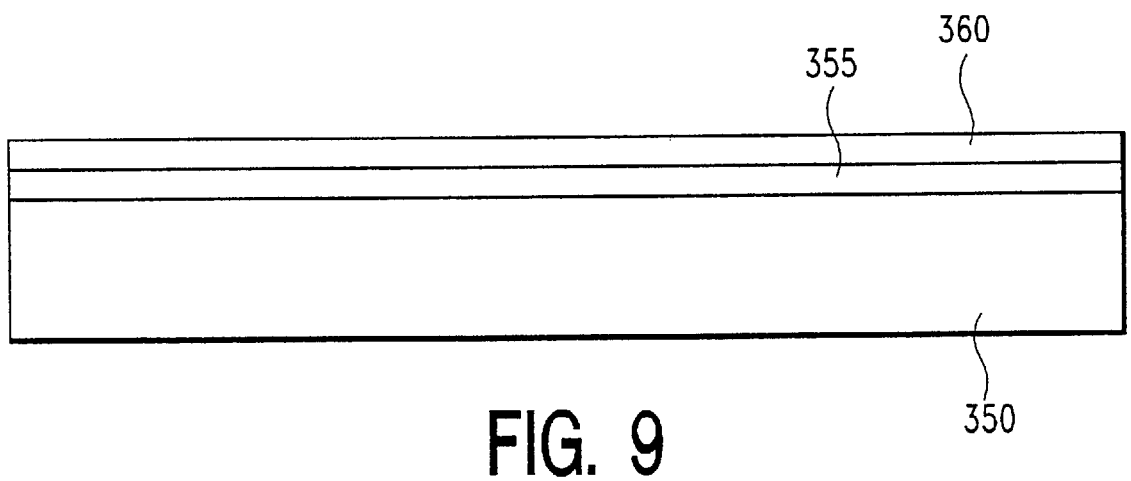
FIG. 9 is a cross sectional view of a wafer showing the resist and contrast enhancement layers of FIGS. 7A and 7B.

At step 300, a photoresist 355 is formed on substrate 350 (shown in FIG. 9). At step 305, a CEL 360 (shown in FIG. 9) is formed on the photoresist 355. At step 315, the photoresist 355 is exposed using a mask having minimum size clear openings corresponding to the ends 367 of the adjacent images 365 to be formed. The exposure produces exposed regions 370 (shown in FIG. 8). In other words, the transparency of the CEL 360 at exposed regions 370 is increased. As a result, the photoresist 355 formed at the ends 367 receives a greater exposure than other regions of the adjacent images 365 during subsequent exposures. Thus, foreshortening effects may be reduced in the adjacent images 365. In this embodiment, the areas 380 between the adjacent images are not exposed as in the embodiments shown in FIGS. 1–6.

At step 320, the photoresist 355 is exposed through the CEL 360 using an image mask (not shown) to form adjacent images 365 in the photoresist 355. The regions of the adjacent images 365 which were not exposed using the coarse exposure have delayed exposure. At step 330, the photoresist 355 and CEL 360 are developed. The adjacent images 365 have been compensated with regard to foreshortening effects.

Figure 7B:
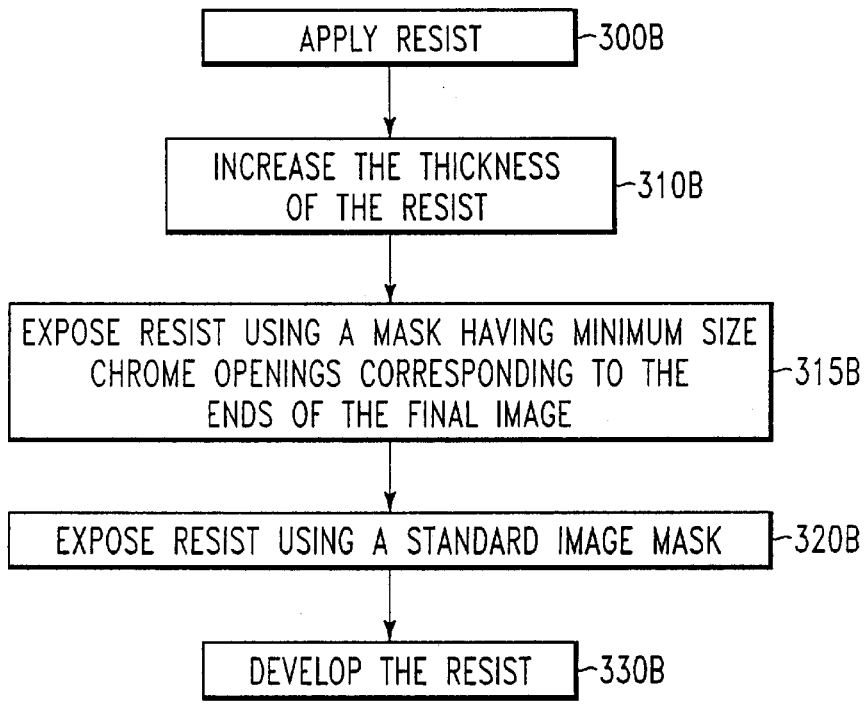
FIG. 7B is a flow chart diagram illustrating a fifth exemplary embodiment of the present invention.

FIG. 7B is a flow chart of an additional exemplary embodiment which does not require use of a CEL. In this case, the tailoring exposure partially exposes the ends 367 of the adjacent images 365. The adjacent images 365 are completely formed using a subsequent exposure with the standard image mask. In this way, the combination of the partial exposure and the subsequent exposure compensates for the foreshortening effects.

In this alternative embodiment, Step 320b directly exposes the resist (without a CEL) using the standard image mask.

Figure 10:
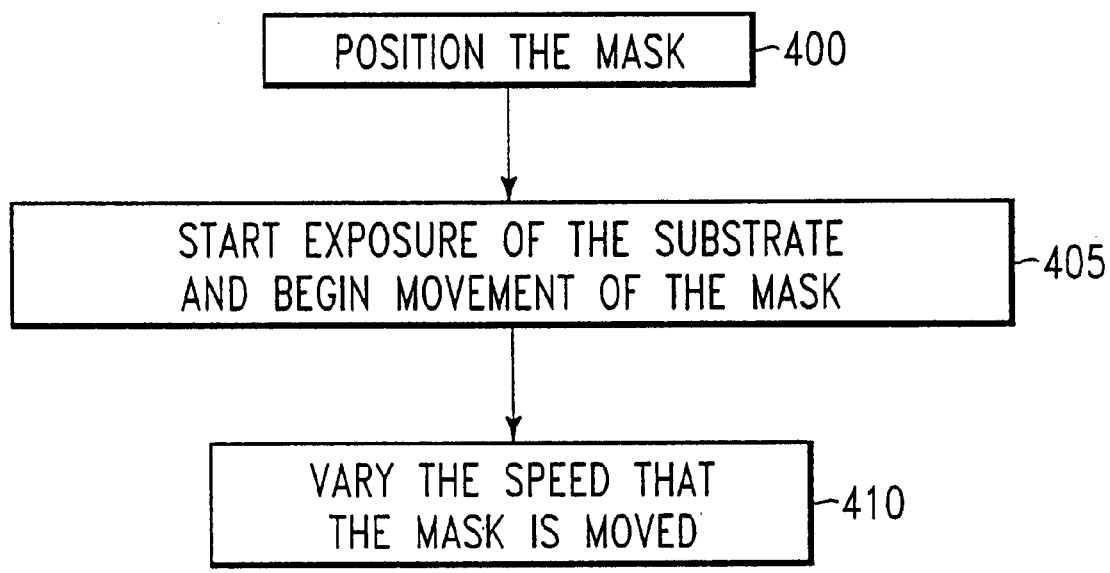
FIG. 10 is a flow chart diagram illustrating a sixth exemplary embodiment of the present invention.

FIG. 10 describes another exemplary embodiment of the present invention. This exemplary embodiment utilizes a smaller image feature on a mask to form a larger image on a substrate by adjusting the exposure time as the mask or substrate is moved. For example, the image feature on a mask for producing a trench capacitor may be replaced with a single, smaller image feature. The width and length of the image feature are chosen to optimize the final image quality. For example, the width of the image feature may be selected to correspond to the width of the trench capacitor. The process shown in FIG. 10 is described below with reference to FIGS. 11A–11D.

At step 400, the image feature 450 is positioned over the image 460 to be formed in the photoresist 455. The photoresist 455 is formed on a substrate (not shown). At step 405, exposure of the substrate is started and the movement of the mask is initiated. FIGS. 11A–11D illustrate the movement of the image feature 450 over the image 460 in the X-direction. Alternatively, the image feature 450 may be scanned in the X and Y-directions as is shown in FIGS. 12A–12D. The image feature 450 may be scanned in any pattern in the X and Y-directions. The scanning pattern may be selected to increase the speed of the scanning process and to reduce the wear on the apparatus moving the image feature 450. In addition, the substrate may be moved instead of the image feature 450.

At step 410, the speed of the mask is varied as the image feature 450 is moved to increase or decrease the exposure of the photoresist in different areas of the image 460. As a result, the amount of exposure may be increased at the ends 465 of the image 460 to reduce image foreshortening and corner rounding. The image feature 450 is scanned over approximately the length of the trench to define the image 460 to be formed.

Scanning allows for the intensity profile along the X-direction (or X and Y directions) to be modified by adjusting the duty cycle of the illuminator, or the scan speed or dwell time (time the image feature is stationary) of the image feature 450. Because of foreshortening, the intensity at the ends 465 is normally reduced as compared to the center 470. To correct for foreshortening the scanning image feature 450 dwells on the ends for some exposure time "T." The image feature 450 is scanned at some specified speed "S," where in general "S" is a function of the position of image feature 450 relative to the image 460 to be formed.

This process includes three variables. These variables are the relative starting and ending locations of the scan L, the dwell times at these locations T, and the scan speed S which, in general, is allowed to vary over the time or position of the scan.

In an alternative embodiment, the scan speed may not be varied but the exposure is increased or decreased using an exposure blanking feature. In this case, the exposure is varied as a function of the position of the image feature 450 by quickly turning the exposure on or off. By adjusting the duty cycle (i.e., percentage of time the exposure is on) as a function of scan position, the image feature 450 can be scanned at a constant speed while the duty cycle is adjusted to vary the exposure with scan position.

Figure 13:
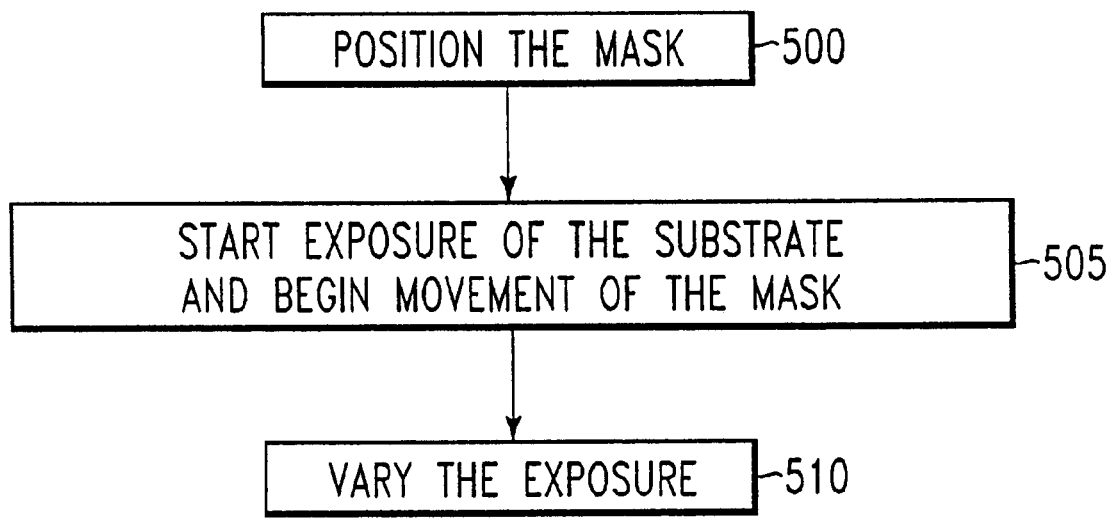
FIG. 13 is a flow chart diagram illustrating a seventh exemplary embodiment of the present invention.
Figure 11A:
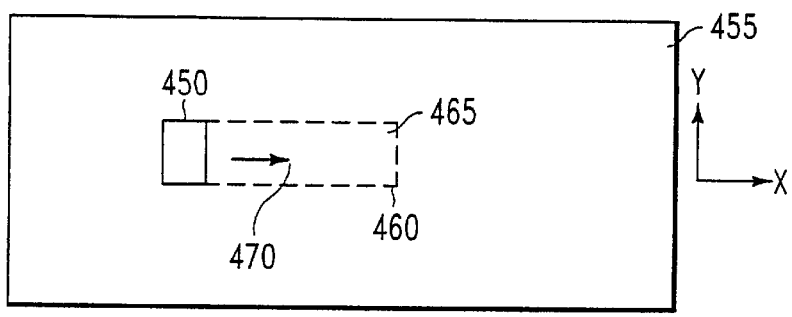
FIGS. 11A, 11B, 11C, and 11D illustrate the movement of the image mask in the x direction relative to the image to be formed according to the sixth exemplary embodiment.
Figure 11B:
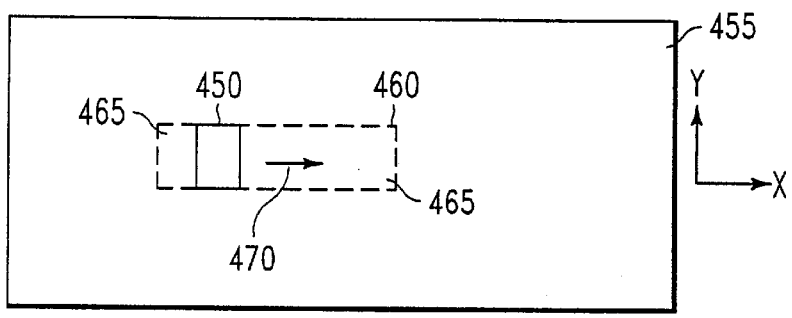
Figure 11C:
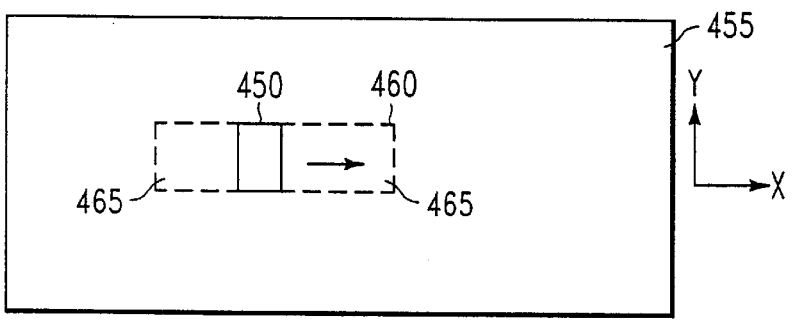
Figure 11D:
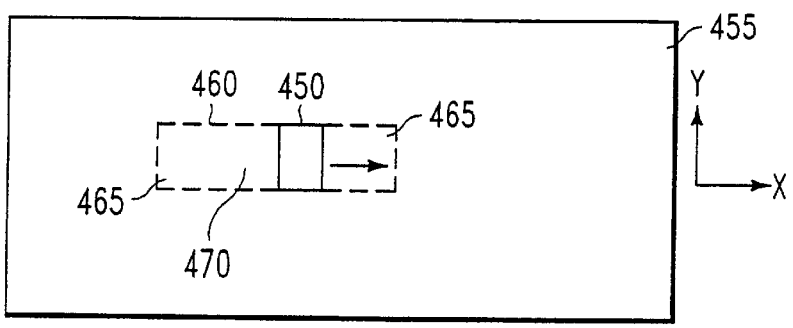
Figure 12A:
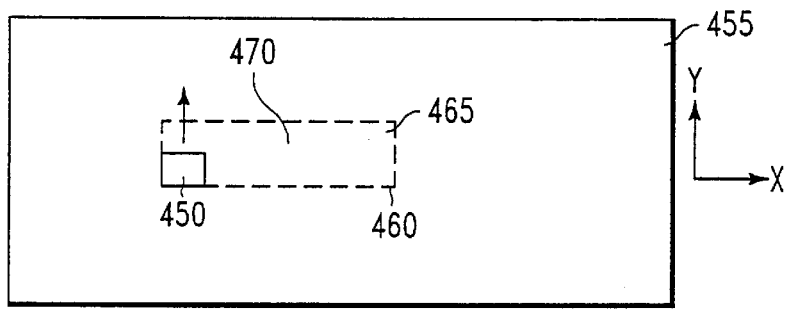
FIGS. 12A, 12B, 12C, and 12D illustrate the movement of the image mask in the x and y directions relative to the image to be formed according to the sixth exemplary embodiment.
Figure 12B:
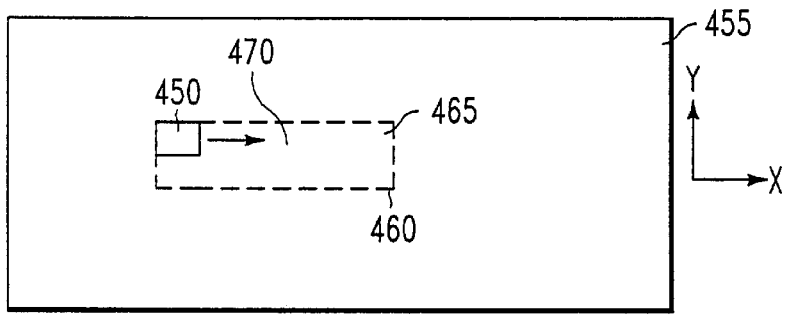
Figure 12C:
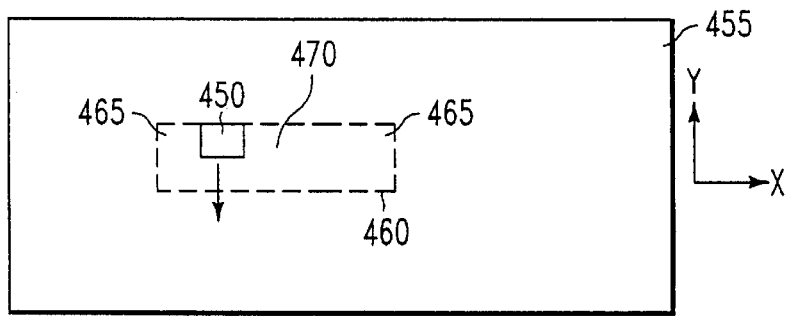
Figure 12D:
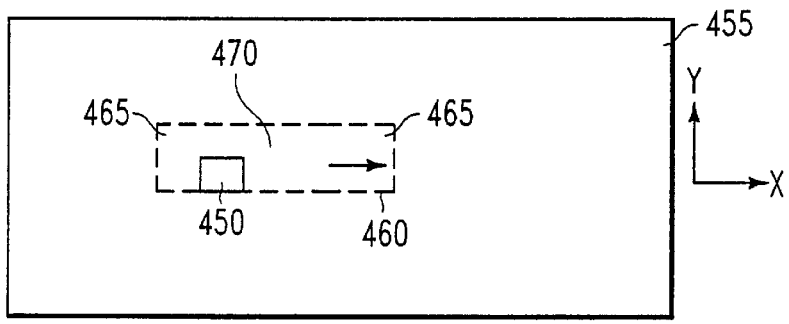
Figure 14:
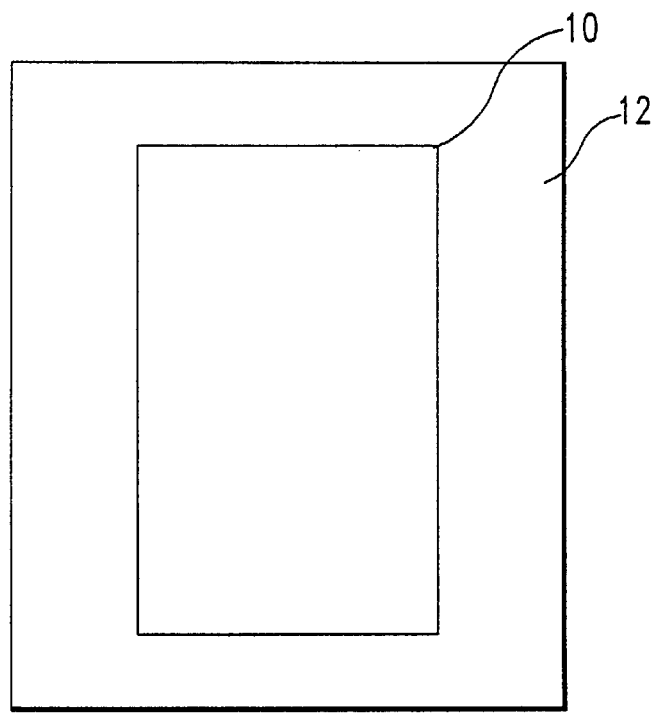
FIG. 14 is an image mask according to the prior art.
Figure 15:
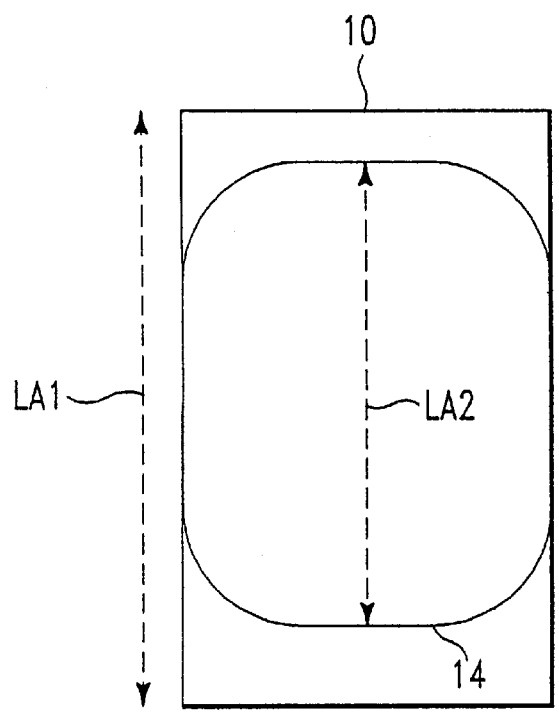
FIG. 15 illustrates image foreshortening using the image mask shown in FIG. 14.

The alternative embodiment is shown in FIG. 13. At step 500, the image feature 450 is positioned over the image 460 to be formed in the photoresist 455. The photoresist 455 is formed on a substrate (not shown). At step 505, exposure of the substrate is started and the movement of the image feature 450 is initiated. At step 510, the exposure of the image 460 is varied by turning the exposure on and off as a function of the location of the image feature 450 with respect to the image 460. The speed of the image feature 450 is not varied. As a result, the amount of exposure may be increased at the ends 465 of the image 460 to reduce image foreshortening. Alternatively, the speed of the mask and the blanking operation may be combined into a single system to control the exposure of the image 460.

Of course, many images 460 can be formed simultaneously using an array of image features 450 on the mask during the scanning step. The array of images can extend across virtually the entire surface of a chip or chips exposed during a single scanning step. An array of extended rectangular images can be used for defining trenches for a DRAM, for example, and the scanning method can be used to avoid corner rounding and foreshortening of each trench image.

Other kinds of images may also be improved by applying the techniques described in the previous embodiments as demonstrated in FIGS. 1, 4A, 4B, 7A and 7B.

Figure 16:
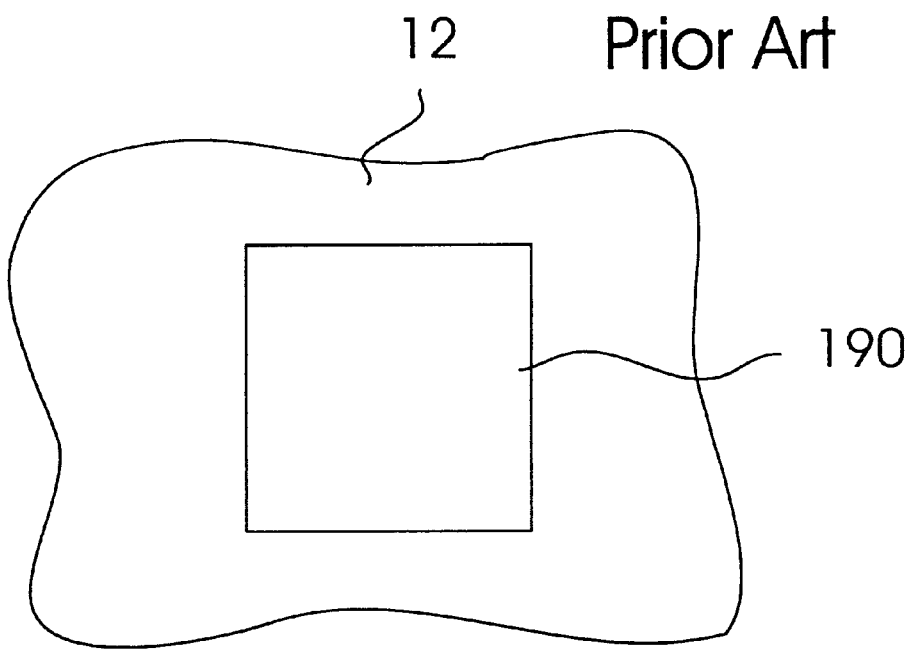
FIG. 16 is an image mask of a contact according to the prior art.
Figure 17:
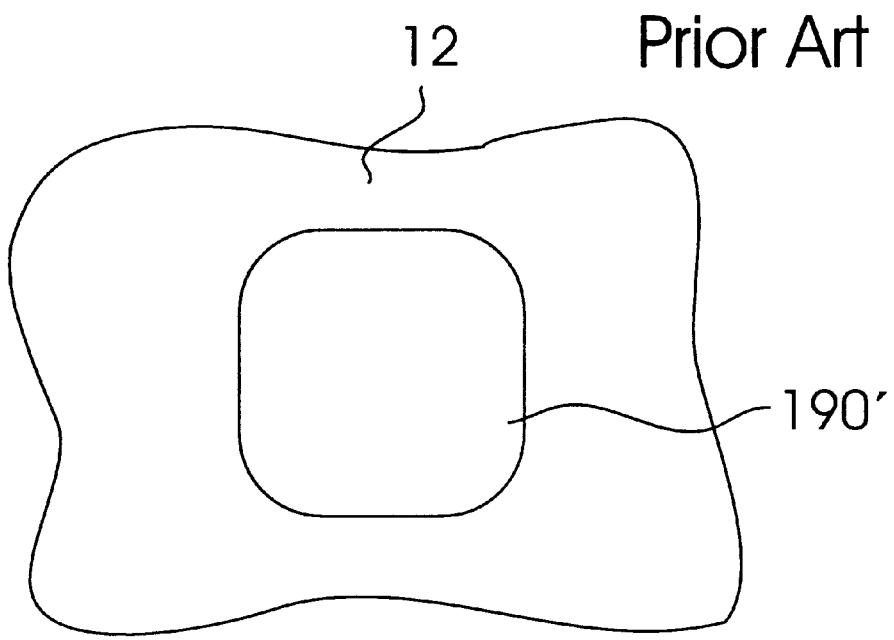
FIG. 17 illustrates corner rounding using the image mask shown in FIG. 16.
Figure 18:
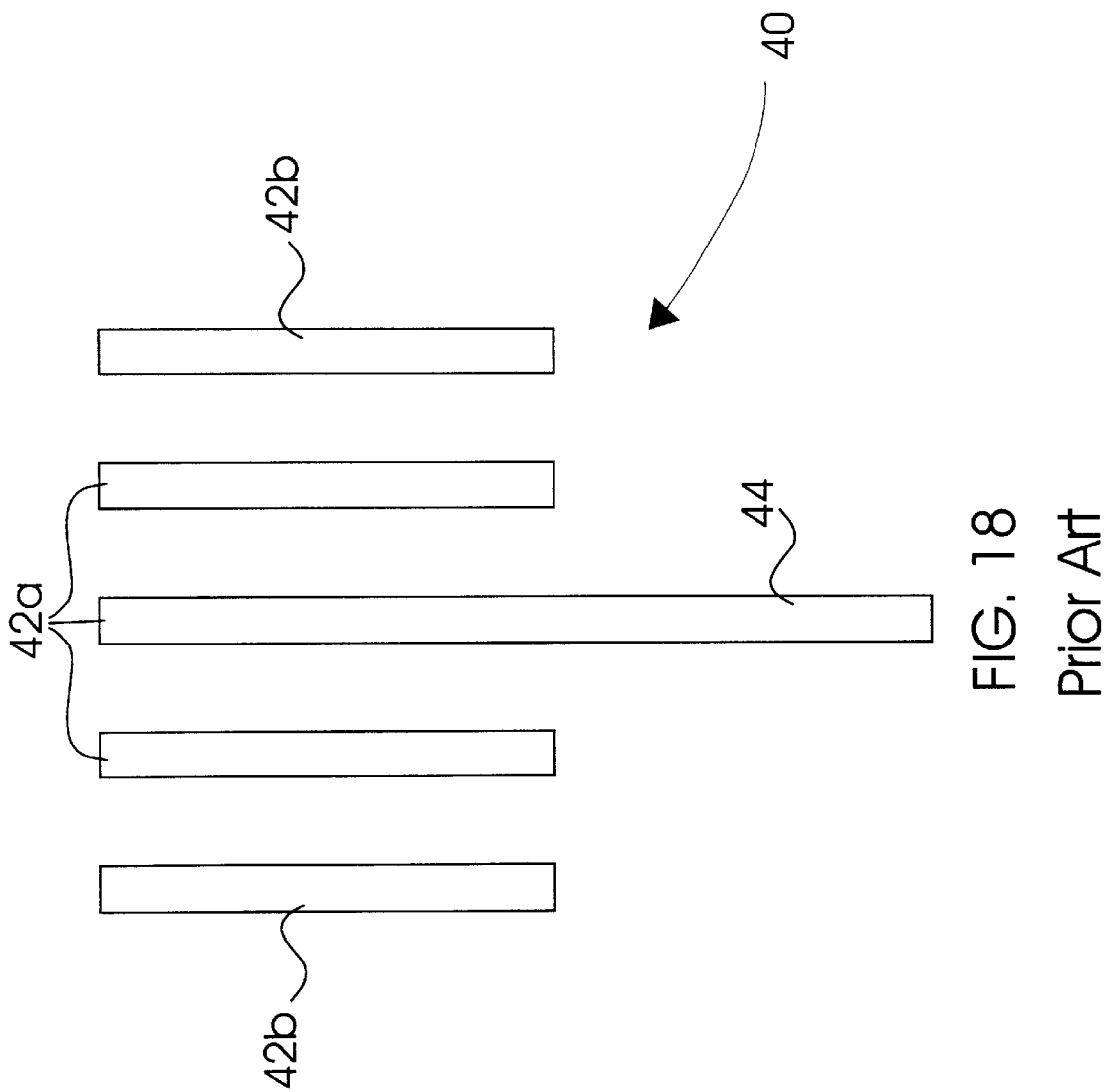
FIG. 18 is an image mask of isolated and nested images according to the prior art.
Figure 22A:
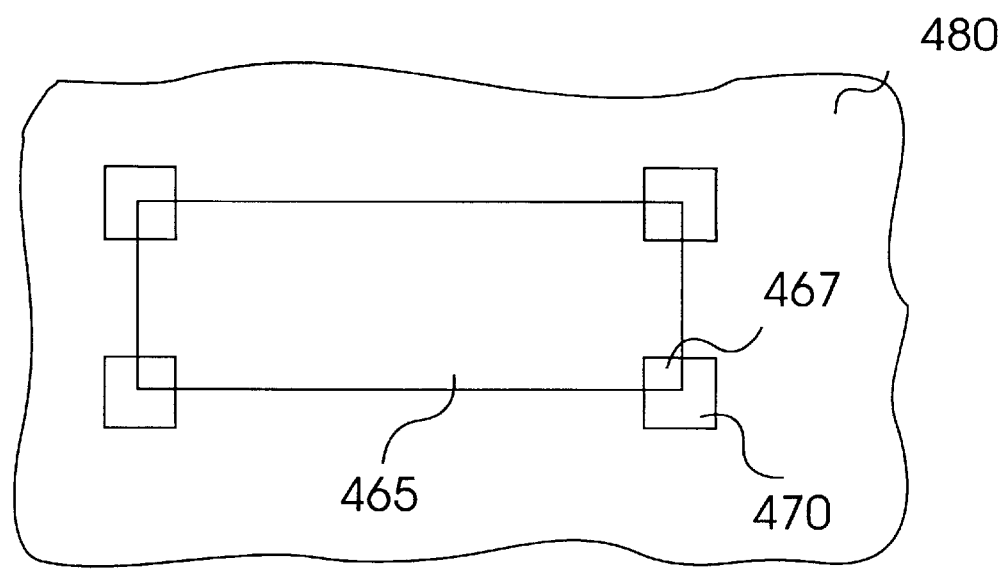
FIGS. 22A and 22B are image masks according to the present invention showing a second exposure through alternate second masks to avoid the corner rounding problem of FIGS. 16 and 17.
Figure 22B:
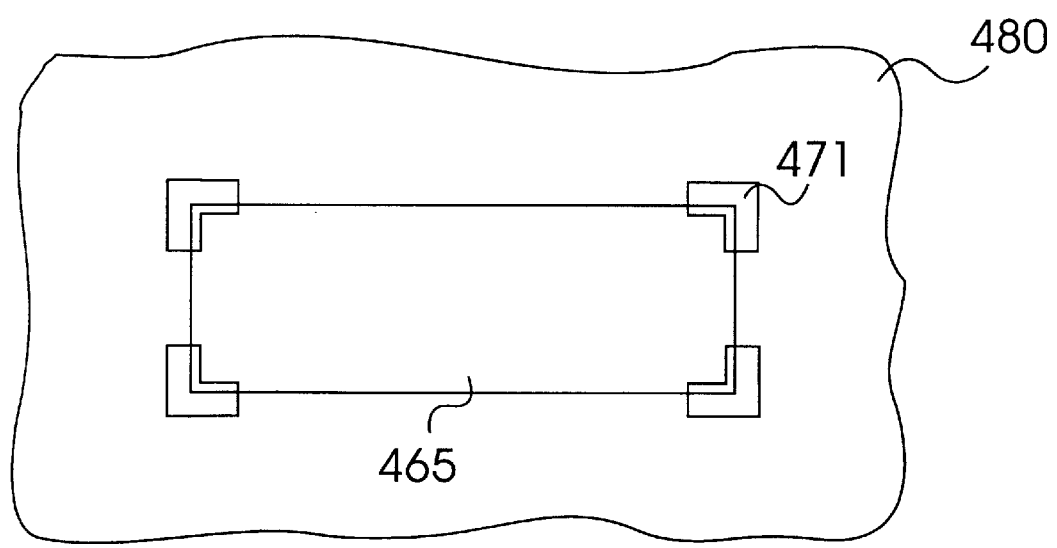

FIGS. 22A and 22B show a solution to the corner rounding problem demonstrated in FIGS. 16 and 17. The standard mask image 465 which would produce a printed image with corner rounding can be printed with reduced corner rounding by executing a tailoring exposure with a second mask in the areas 470 in addition to the standard image exposure. Portion 467 of area 470 receives energy from both the standard exposure and the tailoring exposure, thus reducing corner rounding. As shown in FIG. 22b, various shapes of exposure can be used for the tailoring exposure such as the shape of area 471.

Figure 19:
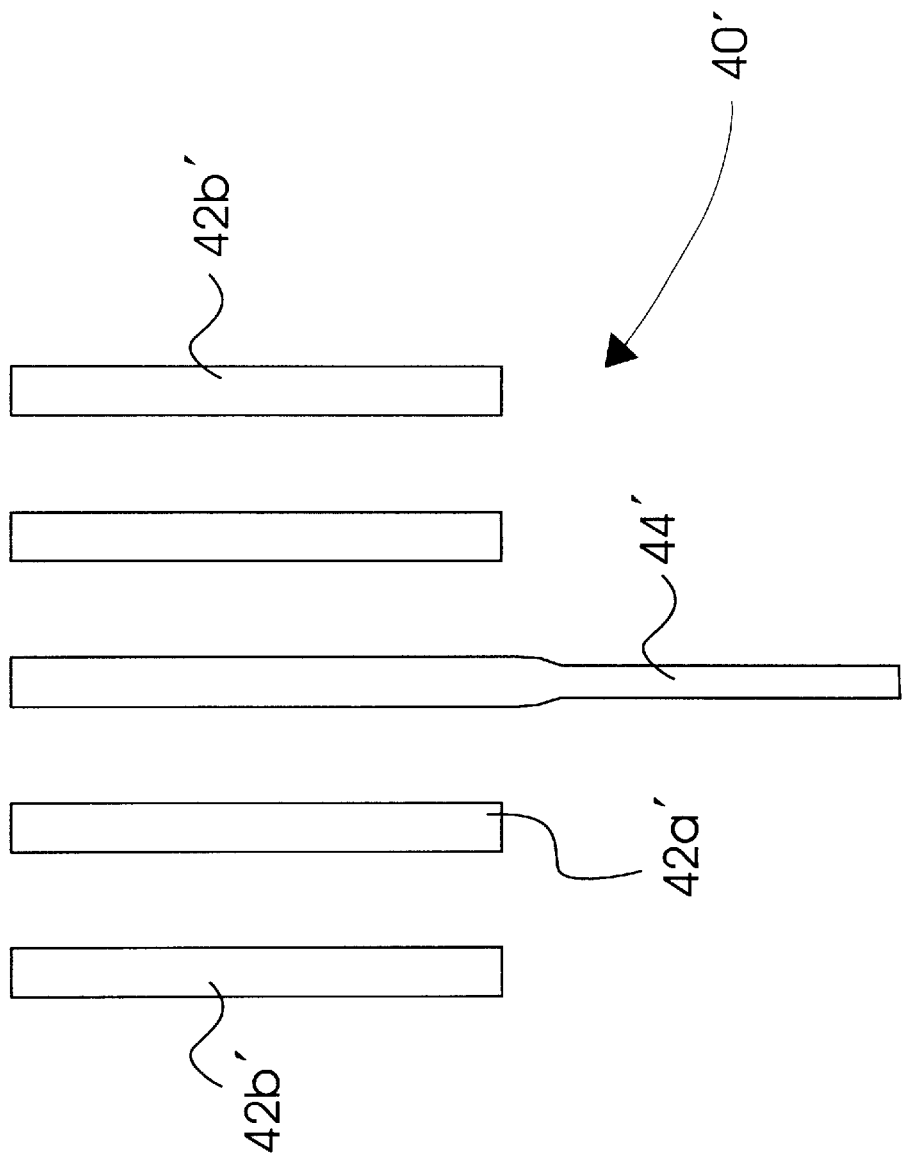
FIG. 19 illustrates line width variation of isolated images compared with nested images using the image mask shown in FIG. 18.
Figures 23A, 23B:
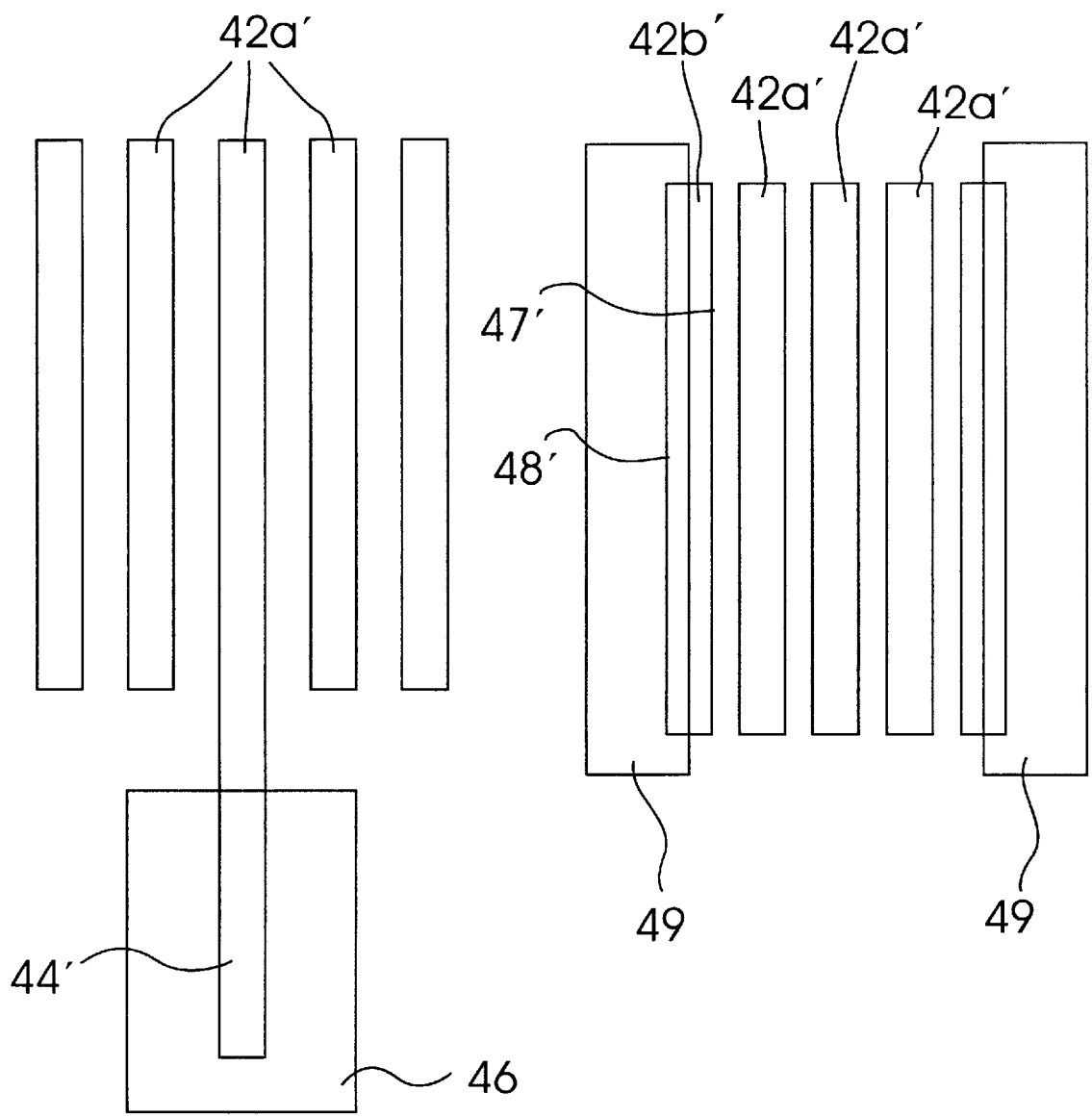
FIG. 23A shows exposures through image masks according to the present invention showing a second exposure through a second mask to avoid the isolated to nested image problem shown in FIGS. 18 and 19.
FIG. 23B shows exposures through image masks according to the present invention showing a second exposure through a second mask to avoid the a printing difference between fully nested lines and partially nested lines.

FIG. 23A shows the solution to the nested to isolated print bias problem, shown in FIG. 19. By introducing a second mask exposure to area 46, the width of isolated image 44' (FIG. 19) can be increased to that of the nested lines 42a'.

With a conventional exposure the outside lines 42b' of a group of nested lines also suffers from a print bias problem. As shown in FIG. 23B, the width of the outside lines 42b' in the group of nested lines can be corrected by an additional low level tailoring exposure on their outside edges 48' represented by area 49 on the second mask. The inside edges 47' already experience additional exposure because of proximity of adjacent line 42a so they need no additional exposure.

Figure 24:
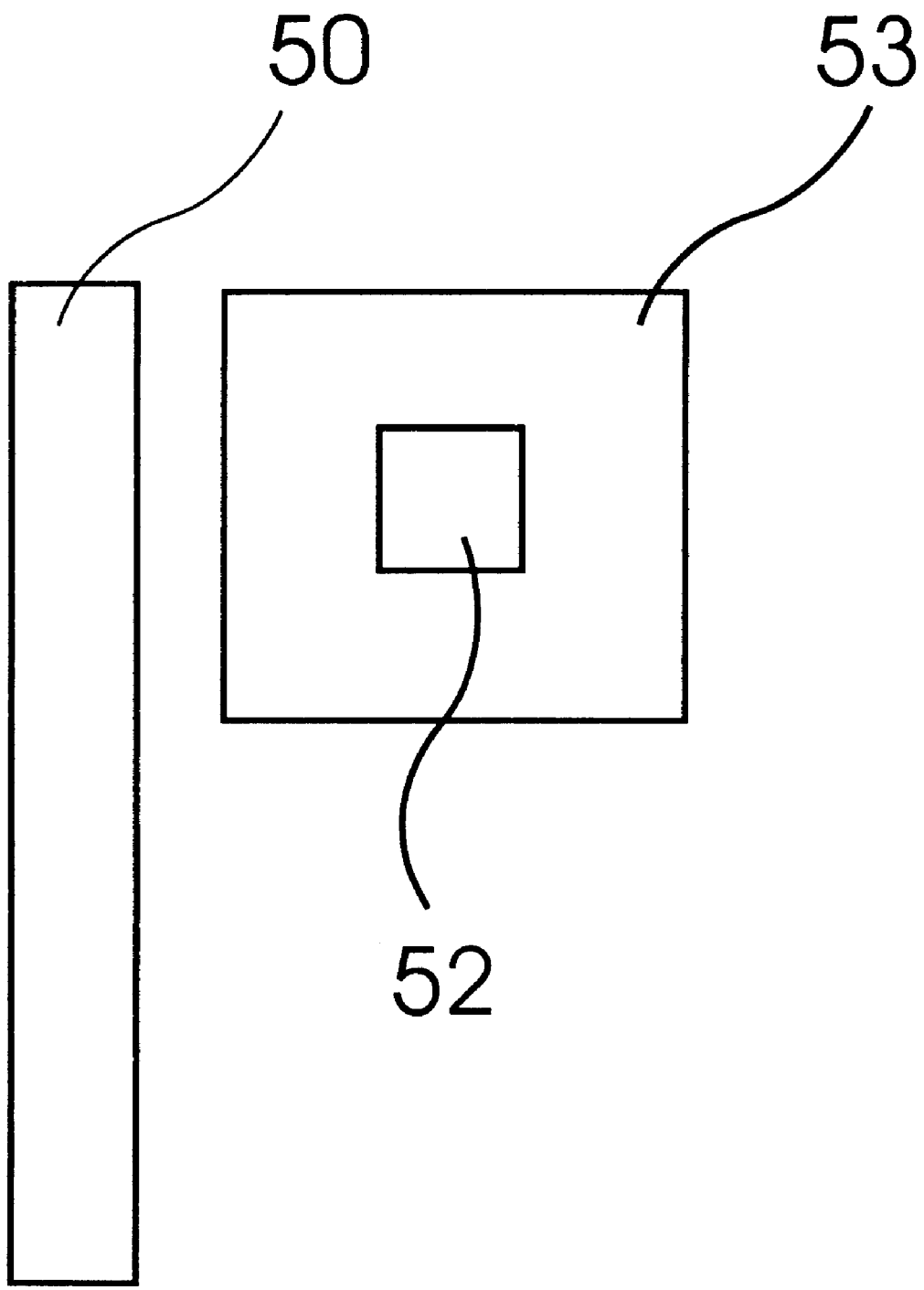
FIG. 24 shows image masks according to the present invention showing a second exposure through a second mask to provide adequate exposure to both a bar and a contact to avoid the printing problem of FIGS. 20 and 21.

FIG. 24 shows the solution to the feature size dependent bias problem shown in FIG. 21. In the absence of a tailoring exposure, when bar 50 is printed at the proper exposure, the contact 52 would be underexposed as shown in FIG. 21. By introducing a tailoring exposure in area 53 with a second mask, exposure of the contact 52 is increased to fully resolve the contact.

Advantageously, the exposure enhancement methods described herein extend the capability of lithography projection tools to satisfactorily print features having dimensions smaller than would normally be possible. Thus, the present invention extends the useful life of lithographic projection tools. It enables semiconductor manufacturers to avoid many of the above described printing problems and to create satisfactory images having smaller dimensions. It postpones the need to purchase very costly shorter wavelength exposure tools. While the present invention adds costs for exposure of a single layer of resist through two masks or for variably scanning a beam over that resist, the present inventors have found that the cost of a second simple mask exposure step is much smaller than the cost of a next generation projection tool to achieve the same printing. Furthermore, because the additional tailoring exposure required in end regions is a fraction (on the order of 10 to 20%) of the overall dose required for printing, projection exposure throughput is reduced by only approximately that same fraction. Again, as compared with the cost of new projection tooling at shorter wavelengths (and the new resist technology that accompanies a shorter wavelength exposure), this additional throughput penalty is small.

While the two exposure patterns could be formed on separate reticles, they could also be formed on a single reticle, but displaced sufficiently so that only one pattern is exposed at a time. After exposing the first pattern, the reticle is displaced to provide the second pattern for the second exposure. A filter can be used in conjunction with the low dose exposure so that both can be used simultaneously on adjacent chips. Two patterns on one reticle eliminates the setup time and alignment tolerance introduced by having the patterns on separate reticles.

The examples and methods described herein above were all presented as applied to improving foreshortening and corner rounding effects that arise from clear mask window openings. Thus, the second tailoring mask was described as having block clear mask window openings to help illuminate regions of the mask that do not receive enough light to result in the intended design pattern. However, these same methods can clearly be applied in the reverse situation where the standard mask pattern consists of opaque regions. In this case, the ends of these opaque regions receive too much light as a result of the factors, such as diffraction, resulting in foreshortening and corner rounding of the opaque image. One again uses two masks and a similar procedure to that described herein above to reduce these effects. The first mask consists of opaque patterns similar to the standard mask, and the second mask consists of opaque block regions overlapping the ends of these desired patterns. In this case, however, the first mask (with opaque regions similar to the standard mask), is exposed with a lower intensity or a shorter length of time, to achieve a 10–20% lower dose than a conventional exposure. The second block opaque mask (containing opaque regions overlapping the ends of the opaque regions of the first mask) is exposed with the low dose (10–20% of the conventional exposure) needed to fully activate those portions of the resist other than those blocked by both masks. The same result occurs as with the clear opening approach described herein above. One can tailor the resulting exposure to achieve a more optimal distribution of light intensity with two masks than with one mask, whether one uses two masks with complementary opaque regions, or two masks with complementary clear regions. These two cases apply for both positive tone resist and for negative tone resist.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process of forming a first pattern in a photosensitive coating on a substrate to compensate for shape distorting factors, the process comprising the steps of:
   (a) providing a substrate;
   (b) coating said substrate with a photosensitive coating;
   (c) providing a first mask having a pattern of images thereon, said images corresponding to a first pattern to be printed in said coating;
   (d) aligning said first mask to said substrate;
   (e) providing a light source having an illunination intensity;
   (f) illuminating through said first mask to expose said coating to a first exposure to provide a first dose; and
   (g) exposing a portion of said first pattern in said coating to a second exposure to provide a second dose to compensate for shape distorting factors by providing a block mask and illuminating through said block mask in addition to illuminating through said first mask, wherein said portion of said first pattern receives additional dose.

2. The process as recited in claim 1, wherein said first and second exposures are performed in either order.

3. The process as recited in claim 2, wherein said second dose is between 5 and 40% of said first dose.

4. The process as recited in claim 3, wherein said first dose and said second dose differ by a factor or 5 or more.

5. The process as recited in claim 4, wherein said first exposure through said first mask exposes a first region on said coating and wherein said second exposure through said block mask exposes a second region en said coating, wherein said second region overlays a portion of said first region and extends beyond said first region.

6. The process as recited in claim 5, further comprising the step of developing, wherein regions of said coating that receive said second exposure but not said first exposure are inadequately exposed to actually form a developed image in said coating.

7. The process as recited in claim 5, wherein said first and said second doses provide adequate exposure to regions of said coating receiving both doses to print images on said coating compensating for distortion.

8. The process as recited in claim 1, wherein said exposing step (g) provides compensatory dose in the vicinity of contacts as compared with bars.

9. The process as recited in claim 1, wherein said exposing step (g) provides compensatory dose in the vicinity of ends of corners.

10. The process as recited in claim 1, wherein said exposing step (g) provides compensatory dose in the vicinity of ends of bars.

11. The process as recited in claim 1, wherein said exposing step (g) provides compensatory dose in the vicinity of isolated lines.

12. The process as recited in claim 1, wherein said exposing step (g) provides compensatory dose in the vicinity of partially isolated lines.

13. The process as recited in claim 1, wherein said exposing step (g) provides compensatory dose in the vicinity of nested lines.

14. A process of forming a first pattern on a substrate, the first pattern having a first end, a second end, and a center area, the process comprising the steps of:
   (a) coating the substrate with a photosensitive coating;
   (b) exposing through a first mask the center area of the first pattern on the photosensitive coating; and
   (c) exposing the first end or the second end of the first pattern on the photosensitive coating without exposing the center area, wherein the first end or the second end receives additional dose.

15. The process as recited in claim 14, wherein step (b) further comprises the steps of:
   (b1) completely exposing the center area of the first pattern on the photosensitive coating; and
   (b2) incompletely exposing the first end or the second end of the first pattern on the photosensitive coating.

16. The process of claim 15, wherein the exposing steps are with a light source.

17. The process of claim 14, wherein the step (b) further comprises the steps of:
   (b1) providing said first mask having a first window; and
   (b2) shining an energy source through the first window onto the photosensitive coating to expose the center portion of the first pattern on the photosensitive coating.

18. The process of claim 17, wherein step (c) further comprises the steps of:
   (c1) providing a second mask having at least a second window; and
   (c2) shining the energy source through the second window onto the first end or the second end of the first pattern without exposing the center area.

19. The process of claim 18, wherein the second window is a block clear opening in the second mask.

20. The process of claim 14, further comprising in said step (a) the step of coating the substrate with a contrast enhancement layer, wherein said exposing step (c) is accomplished before said exposing step (b).

21. A process of forming a first pattern on a substrate having a photosensitive coating, the first pattern having a first end, a second end, and a center area, the process comprising the steps of:
   (a) forming a contrast enhancement layer over the photosensitive coating;
   (b) providing a first exposure through a first mask to the contrast enhancement layer;
   (c) providing a second exposure through a second mask and through said contrast enhancement layer to expose said photosensitive coating, wherein the fist end or the second end receives additional dose; and
   (d) developing said photosensitive coating.

22. The process of claim 21 wherein in said providing step (b), said first exposure exposes portions of said contrast enhancement layer overlapping said first end or said second end without exposing said center area.

23. The process of claim 22 wherein in said providing step (b), said first exposure bleaches said exposed portions of said contrast enhancement layer.

24. A process of forming an image, comprising the steps of:
   (a) providing a mask having an array of windows;
   (b) providing a substrate having a photosensitive coating;
   (c) shining a light source through said array of windows onto said photosensitive coating while scanning one of said mask and said substrate to produce scan-derived images of said array of windows in said photosensitive coating.

25. The process as recited in claim 24, wherein said step (c) comprises the step of scanning along a line.

26. The process as recited in claim 24, wherein said step (c) comprises the step of scanning in two dimensions.

27. The process as recited in claim 24, wherein said step (c) comprises the step of scanning, at a constant speed.

28. The process as recited in claim 24, wherein said step (c) comprises scanning, at a variable speed to provide a varying exposure at different parts of said images.

29. The process as recited in claim 24, wherein said step (c) further comprises the step of dwelling at a first end of said images.

30. The process as recited in claim 24, wherein said step (c) produces an array of elongated images.

31. The process as recited in claim 30, wherein said step (c) eliminates foreshortening in said elongated images.

32. The process as recited in claim 30, wherein said elongated images are adapted to an array of trenches.

33. The process as recited in claim 32, wherein said array of trenches form capacitors.

34. The process as recited in claim 24, wherein said step (c) comprises shining said light source onto said photosensitive coating to expose said photosensitive coating by dwelling on end portions of said images and scanning in center portions of said images.

35. The process as recited in claim 24, wherein said images comprises end portions and center portions, and wherein said step (c) comprises shining said light source onto said photosensitive coating to expose the photosensitive coating by dwelling on said end portions and scanning in said center portions.

36. The process as recited in claim 24, wherein said scanning step (c) comprises the step of changing intensity during said scanning.

37. The process as recited in claim 24, wherein said light source has a duty cycle and wherein said scanning step (c) comprises the step of changing said duty cycle during said scanning.

38. A process of forming a first pattern in a photosensitive coating on a substrate to compensate for shape distorting factors, the process comprising the steps of:
   (a) providing a substrate;
   (b) coating said substrate with a photosensitive coating;
   (c) providing a first mask comprising a first pattern thereon;
   (d) aligning said first mask to said substrate;
   (e) illuminating said coating with a first dose through said first mask to expose a region of said coating corresponding to said first pattern;
   (f) providing a second mask comprising a second pattern thereon different from said first pattern, wherein said second pattern overlays a portion of said first pattern and extends beyond said first pattern;
   (g) aligning said second mask to said substrate, wherein said second pattern has no edge extending along an edge of said first pattern; and
   (h) illuminating said coating with a second dose through said second mask to expose a region of said coating corresponding to said second pattern wherein said portion of said first pattern overlaid by said second pattern receives additional dose.

39. The process as recited in claim 38, wherein said second dose is between 5 and 40% of said first dose.

40. The process as recited in claim 39, wherein said first dose and said second dose differ by a factor or 5 or more.

41. The process as recited in claim 38, further comprising the step of developing, wherein regions of said coating that receive said second dose but not said first dose are inadequately exposed to actually form a developed image in said coating.

42. The process as recited in claim 41, wherein said first and said second doses provide adequate exposure to regions of said coating receiving both doses to print images on said coating compensating for distortion.

43. The process as recited in claim 38, wherein alignment of said first mask and second mask is not critical.

44. The process as recited in claim 38, wherein said first pattern comprises a first end, a second end, and a center area, wherein said illuminating step (e) comprises the step of exposing said center area of said first pattern on said photosensitive coating; and wherein said step (g) comprises the step of exposing said first end or said second end of said first pattern on said photosensitive coating without exposing said center area.

45. The process as recited in claim 44, wherein said illuminating step (e) comprises the steps of:
   (e1) completely exposing said center area of said first pattern on said photosensitive coating; and
   (e2) incompletely exposing said first end or said second end of said first pattern on said photosensitive coating.

46. The process of claim 38, wherein said second pattern is a block clear opening in said second mask.

47. The process of claim 46, further comprising in said step (b) the step of forming a contrast enhancement layer over said photosensitive coating, wherein said illuminating step (h) is accomplished before said illuminating step (e).

48. The process of claim 47, wherein said illuminating step (h) bleaches said region of said contrast enhancement layer.

49. A process of forming a first pattern in a photosensitive coating on a substrate to compensate for shape distorting factors, the process comprising the steps of:
   a) providing a substrate;
   b) coating said substrate with a photosensitive coating;
   c) providing a first mask comprising a first pattern thereon;
   d) aligning said first mask to said substrate;
   e) illuminating said coating through said first mask while scanning one of said mask and said substrate to produce a scan-derived image of said first pattern in said photosensitive coating.

50. The process as recited in claim 49, wherein said illuminating step (e) comprises the step of scanning along a line.

51. The process as recited in claim 49, wherein said illuminating step (e) comprises the step of scanning in two dimensions.

52. The process as recited in claim 49, wherein said illuminating step (e) comprises the step of scanning at a constant speed.

53. The process as recited in claim 49, wherein said illuminating step (e) comprises scanning at a variable speed to provide a varying exposure at different parts of said images.

54. The process as recited in claim 49, wherein said illuminating step (e) further comprises the step of dwelling at a first end of said images.

55. The process as recited in claim 49, wherein said illuminating step (e) produces an array of elongated images.

56. The process as recited in claim 55, wherein said illuminating step (e) eliminates foreshortening in said elongated images.

57. The process as recited in claim 55, wherein said elongated images are adapted to an array of trenches.

58. The process as recited in claim 57, wherein said array of trenches form capacitors.

59. The process as recited in claim 49, wherein said illumining step (e) comprises shining said light source onto said photosensitive coating to expose said photosensitive coating by dwelling on end portions of said images and scanning in center portions of said images.

60. The process as recited in claim 49, wherein said images comprise end portions and center portions, and wherein said illuminating step (e) comprises shining said light source onto said photosensitive coating to expose the photosensitive coating by dwelling on said end portions and scanning in said center portions.

61. The process as recited in claim 49, wherein said scanning step (e) comprises the step of changing intensity during said scanning.

62. The process as recited in claim 49, wherein said light source has a duty cycle and wherein said scanning step (e) comprises the step of changing said duty cycle during said scanning.

63. A process of forming a first pattern in a photosensitive coating on a substrate to compensate for shape distorting factors, the process comprising the steps of:
(a) providing a substrate;
(b) coating said substrate with a photosensitive coating;
(c) providing a first mask having a pattern of images thereon, said images corresponding to a first pattern to be printed in said coating;
(d) aligning said first mask to said substrate;
(e) providing a light source having an illumination intensity;
(f) illuminating through said first mask to expose said coating to a first exposure to provide a first dose; and
(g) exposing a portion of said first pattern in said coating to a second exposure to provide a second dose to compensate for shape distorting factors by varying said illumination intensity while scanning said first mask in said illuminating step (f), or by varying scanning speed during said illuminating step (f), wherein said portion of said first pattern receives additional dose.

64. The process as recited in claim 63, wherein said exposing step (g) provides compensatory dose in the vicinity of contacts as compared with bars.

65. The process as recited in claim 63, wherein said exposing step (g) provides compensatory dose in the vicinity of ends of corners.

66. The process as recited in claim 63, wherein said exposing step (g) provides compensatory dose in the vicinity of ends of bars.

67. The process as recited in claim 63, wherein said exposing step (g) provides compensatory dose in the vicinity of isolated lines.

68. The process as recited in claim 63, wherein said exposing step (g) provides compensatory dose in the vicinity of partially isolated lines.

69. The process as recited in claim 63, wherein said exposing step (g) provides compensatory dose in the vicinity of nested lines.

70. The process as recited in claim 63, wherein said exposing step (g) comprises variably scanning a light across said first mask.

71. The process as recited in claim 70, wherein the step of variably scanning a light across said first mask comprises changing speed of said scanning during said scanning step.

72. The process as recited in claim 70, wherein the step of variably scanning a light across said first mask comprises dwelling on a location.

73. The process as recited in claim 70, wherein the step of variably scanning a light across said first mask comprises dwelling on two locations.

74. The process as recited in claim 70, wherein the step of variably scanning a light across said first mask comprises changing intensity during said scanning.

75. The process as recited in claim 70, wherein the step of variably scanning a light across said first mask comprises changing duty cycle during said scanning.

\* \* \* \* \*